(12) United States Patent
Pan et al.

(10) Patent No.: US 9,269,761 B2
(45) Date of Patent: Feb. 23, 2016

(54) METAL-INSULATOR-METAL CAPACITOR

(71) Applicant: Taiwan Semiconductor Manufacturing Company, Ltd., Hsin-Chu (TW)

(72) Inventors: Yu-Hong Pan, Tainan (TW); Jen-Pan Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 6 days.

(21) Appl. No.: 13/791,195

(22) Filed: Mar. 8, 2013

(65) Prior Publication Data

US 2014/0252549 A1 Sep. 11, 2014

(51) Int. Cl.
*H01L 49/02* (2006.01)

(52) U.S. Cl.
CPC ............... *H01L 28/60* (2013.01); *H01L 28/65* (2013.01)

(58) Field of Classification Search
CPC ................................ H01L 28/60; H01L 28/65
USPC ........................................... 257/303, E21.647
See application file for complete search history.

(56) References Cited

U.S. PATENT DOCUMENTS

| 7,436,020 B2 * | 10/2008 | Forbes ........................ 257/320 |
| 2008/0079033 A1 * | 4/2008 | Waite et al. ................... 257/255 |
| 2013/0093012 A1 * | 4/2013 | Zhang et al. .................. 257/335 |

* cited by examiner

*Primary Examiner* — Amar Movva
(74) *Attorney, Agent, or Firm* — Slater & Matsil, L.L.P.

(57) ABSTRACT

An embodiment metal-insulator-metal (MiM) capacitor includes a gate stack disposed upon an insulation layer, the gate stack including a gate metal, the gate metal serving as a bottom electrode, a dielectric layer disposed upon the gate stack, and a top metal layer disposed upon the dielectric layer, the top metal serving as a top electrode.

19 Claims, 3 Drawing Sheets

_US 9,269,761 B2_

METAL-INSULATOR-METAL CAPACITOR

BACKGROUND

Semiconductor devices may include various types of capacitors such as, for example, metal-oxide-semiconductor (MOS) capacitors, P-N junction capacitors, polysilicon-insulator-polysilicon (PIP) capacitors, and metal-insulator-metal (MIM) capacitors.

Because a metal is used as an upper electrode and/or a lower electrode of the MIM capacitor instead of a monocrystalline silicon layer or a polycrystalline silicon layer, the MIM capacitor offers reduced electrode resistance. As such, the MIM capacitor is particularly suitable for use in integrated circuits that operate at high-speed. In addition, because the capacitance of the MIM capacitor is largely unaffected by variations in voltage and temperature, the MIM capacitor can be used in analog integrated circuits.

In the conventional semiconductor processes, the MIM capacitor is formed by back end of line (BEOL) metal. Unfortunately, generating the MIM capacitor using BEOL routing is complicated.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely a metal-insulator-metal (MiM) capacitor. The disclosure may also be applied, however, to other integrated circuits, electronic structures, and the like.

Figure 1:
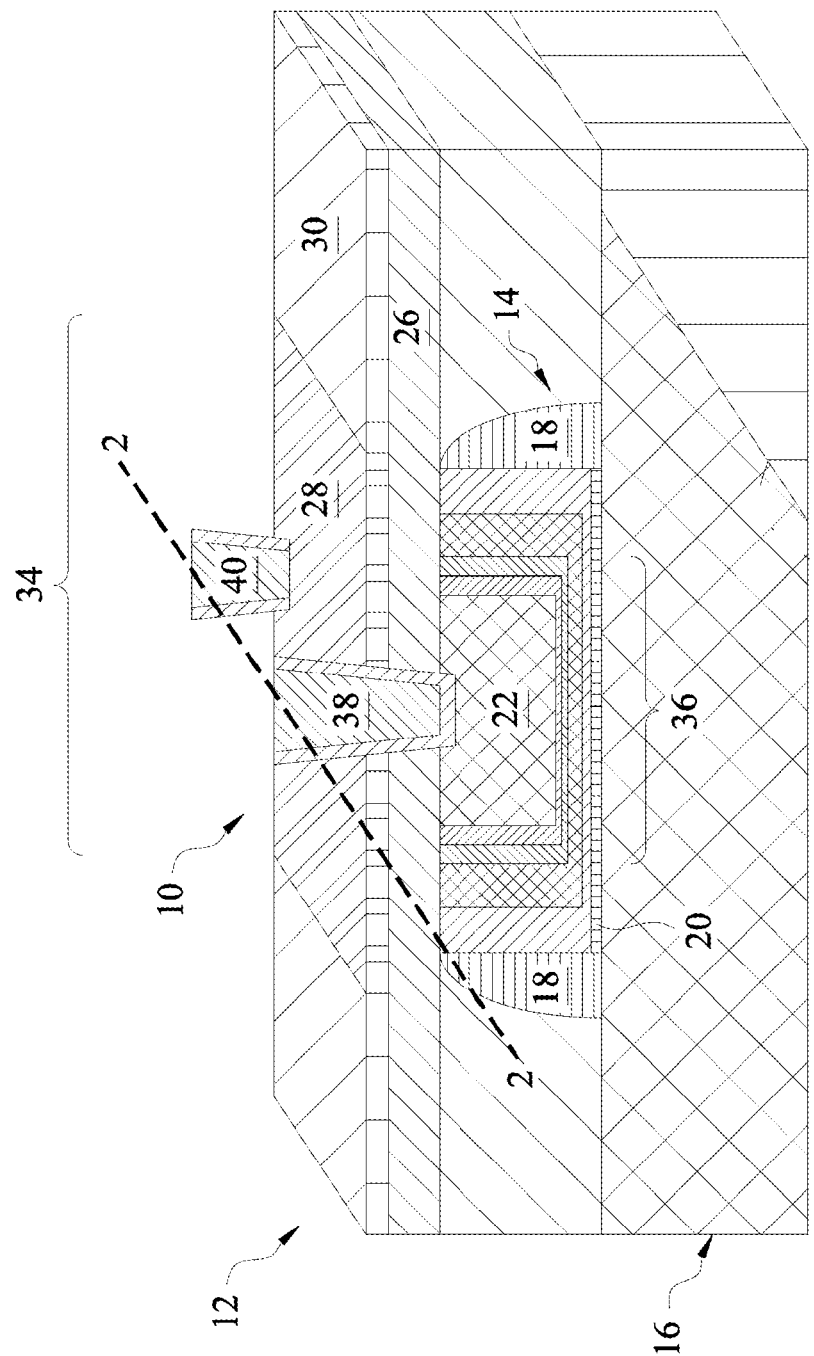
FIG. 1 illustrates an embodiment metal-insulator-metal (MiM) capacitor.

Referring now to FIG. 1, an embodiment metal-insulator-metal (MiM) capacitor 10 is illustrated within a representative portion of a semiconductor device 12. As shown, the MiM capacitor 10 includes a gate stack 14 disposed over an isolation layer 16. In an embodiment, the gate stack 14 is disposed upon the isolation layer. In an embodiment, the isolation layer 16 is formed from, for example, silicon oxide or another suitable insulating material.

Still referring to FIG. 1, the gate stack 14 includes, for example, gate spacers 18, a gate dielectric 20, and a gate metal 22. It should be recognized that the gate stack 14 may include additional layers, materials, and so on, supporting or surrounding the gate metal 22 in order to form a suitable gate for the semiconductor device 12 in practical applications. For example, the gate stack 14 may include silicon oxide, silicon nitride, or another suitable dielectric material.

Figure 2:
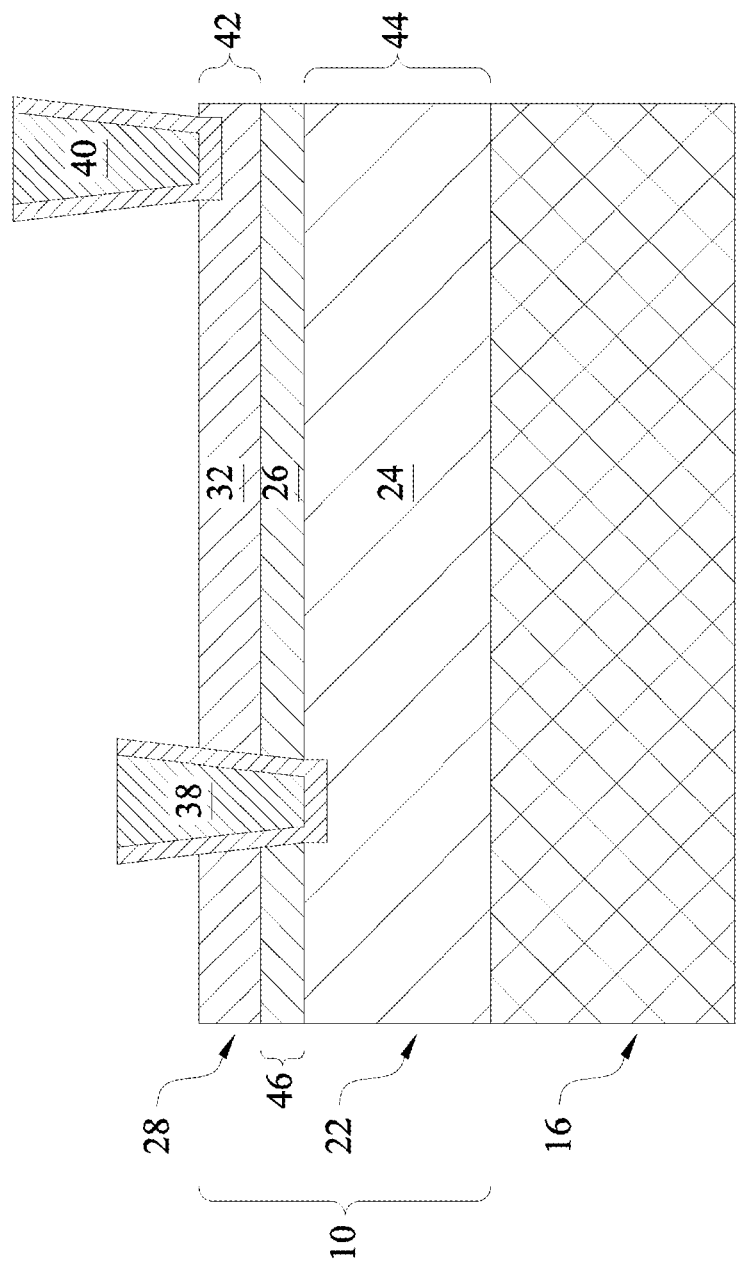
FIG. 2 illustrates a cross section of the embodiment metal-insulator-metal capacitor of FIG. 1 taken generally along line 2-2.

As shown in FIG. 1, the gate spacers 18 are on opposing sides of the gate dielectric 20. In addition, the gate metal 22 is generally disposed over the gate dielectric 20. In an embodiment, the gate metal 22 is formed from tungsten (W), aluminum (Al), titanium (Ti), titanium nitride (TiN), tantalum (Ta), copper (Cu), molybdenum (Mo), platinum (Pt), hafnium (hf), ruthenium (Ru), or another suitable gate material. As will be more fully explained below, the gate metal 22 will serve or function as a bottom electrode 24 for the MiM capacitor 10 as shown in FIG. 2.

Still referring to FIG. 1, the MiM capacitor 10 includes a dielectric layer 26 disposed over the gate stack 14. In an embodiment, the dielectric layer 26 is disposed upon the gate stack 14. In an embodiment, the dielectric layer 26 is formed from silicon dioxide ($SiO_2$), silicon nitride (SiN), hafnium oxide ($HfO_2$), aluminum oxide ($Al_2O_3$), or another suitable dielectric material. In an embodiment, a chemical-mechanical planarization (CMP) process is performed on the gate metal 22 prior to the dielectric layer 26 being formed or deposited.

Still referring to FIG. 1, a top metal layer 28 is disposed over the dielectric layer 26. In an embodiment, the top metal layer 28 is disposed upon the dielectric layer 26. As shown, an insulation layer 30 or non-conductive material may be formed on opposing sides of the top metal layer 28. In an embodiment, the top metal layer 28 is formed from tungsten (W), aluminum (Al), titanium nitride (TiN), copper (Cu), or another suitable metal. As will be more fully explained below, the top metal layer 28 will serve or function as a top electrode 32 for the MiM capacitor 10 as shown in FIG. 2.

In an embodiment, the top metal layer 28 and the gate metal 22 are formed using the same material. However, in another embodiment the top metal layer 28 and the gate metal 22 may be formed from different materials. In an embodiment, a width 34 of the top metal layer 28 is greater than a width 36 of the gate metal 22.

As shown in FIG. 1, the gate metal 22 is in electrical communication with a contact plug 38. In an embodiment, the contact plug 38 passes through the dielectric layer 26 and the top metal layer 28. The top metal layer 28 is also in electrical communication with a contact plug 40.

Referring now to FIG. 2, the MiM capacitor 10 of FIG. 1 is illustrated in cross section and in a simplified form. As shown, the dielectric layer 26 is interposed or sandwiched between the top electrode 32 and the bottom electrode 24, which is supported by the isolation layer 16. In an embodiment, a thickness 42 of the top electrode is less than a thickness 44 of the bottom electrode 24. Also, in an embodiment a thickness 46 of the dielectric layer 26 may be greater or less than either of that of the top and bottom electrodes 32, 24 depending on, for example, the desired capacitance to be achieved by the MiM capacitor 10. Indeed, it should be recognized that the MiM capacitor 10 may be tuned to provide a desired capacitance by, for example, varying the size, dimensions, spacing or parameters of the top electrode 32, the bottom electrode 24, and/or the dielectric layer 26 or varying the materials used to form them.

Still referring to FIG. 2, the bottom electrode 24, which is formed by the gate metal 22 of FIG. 1, is electrically coupled to the contact plug 38. In an embodiment, the contact plug 38 passes through the dielectric layer 26 and the top metal layer 28. The top electrode 32, which is formed by the top metal layer 28 of FIG. 1, is electrically coupled to the second contact plug 40. Through the contact plugs 38, 40, the MiM capacitor 10 may be charged and discharged or otherwise utilized.

Figure 3:
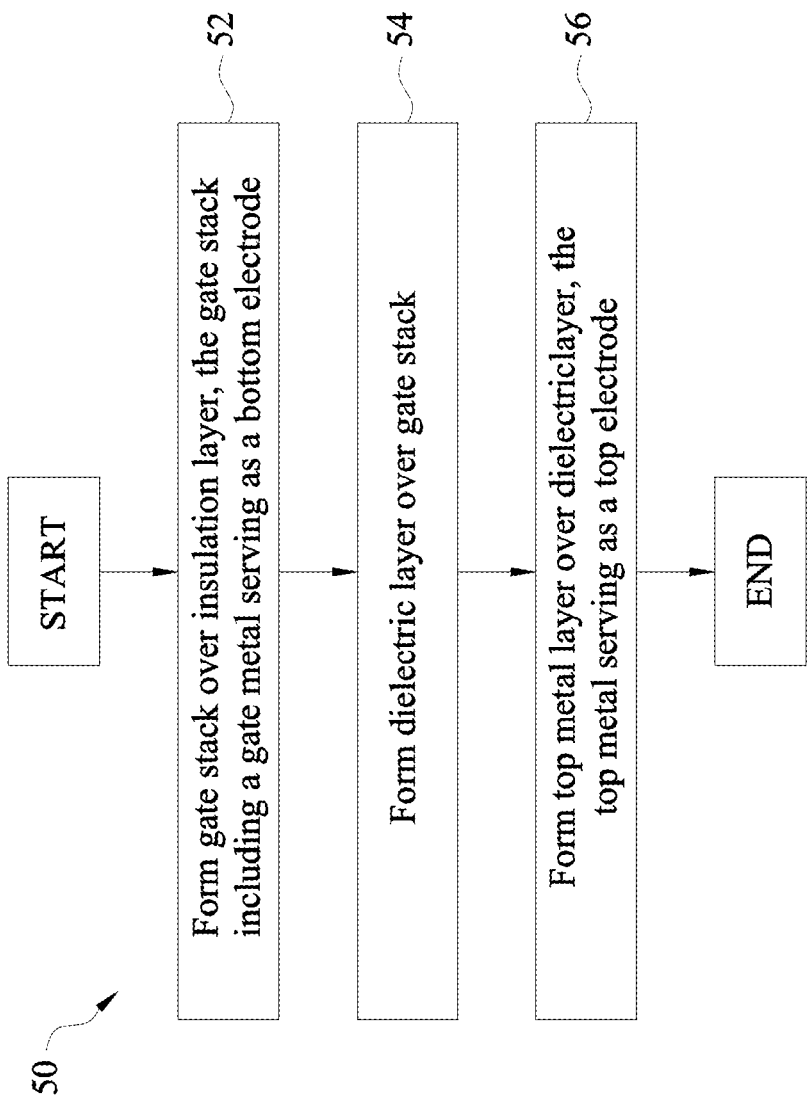
FIG. 3 illustrates an embodiment method of making the embodiment metal-insulator-metal capacitor of FIG. 1.

Referring now to FIG. 3, an embodiment method 50 of making the embodiment MiM capacitor 10 of FIG. 1 is illustrated. In block 52, a gate stack is formed over an insulation layer. As noted above, the gate stack includes a gate metal and serves as a bottom electrode. In block 54, a dielectric layer is formed over the gate stack. In block 56, a top metal layer is formed over the dielectric layer. As noted above, the top metal layer serves as a top electrode. In an embodiment, the top metal layer is patterned with a single mask to form the top electrode. In an embodiment, a chemical-mechanical planarization (CMP) process is performed on the gate metal prior to the dielectric layer being formed.

From the foregoing, it should be the MiM capacitor 10 or the process of forming the MiM capacitor 10 offer advantages. For example, fabrication of the MiM capacitor 10 may be beneficially combined into the gate metal (i.e., gate stack) formation process. Moreover, the MiM capacitor 10 may be tuned by using a similar film scheme with the gate metal. In other words, the capacitor film scheme is similar to that of the gate metal and, as such, no extra process steps are needed.

In addition, the MiM capacitor 10 is permits a process simplification and a mask reduction in the fabrication or manufacturing thereof. Still further, the MiM capacitor 10 offers a relatively high electrical capacity (i.e., capacitance) per unit area.

An embodiment method of forming a metal-insulator-metal (MiM) capacitor includes forming a gate stack over an insulation layer, the gate stack including a gate metal serving as a bottom electrode, forming a dielectric layer over the gate stack, and forming a top metal layer over the dielectric layer, the top metal layer serving as a top electrode.

An embodiment metal-insulator-metal (MiM) capacitor includes a gate stack including a gate metal, the gate metal serving as a bottom electrode, a dielectric layer disposed over the gate stack, and a top metal layer disposed over the dielectric layer, the top metal serving as a top electrode.

An embodiment metal-insulator-metal (MiM) capacitor includes a gate stack disposed upon an insulation layer, the gate stack including a gate metal, the gate metal serving as a bottom electrode, a dielectric layer disposed upon the gate stack, and a top metal layer disposed upon the dielectric layer, the top metal serving as a top electrode.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A metal-insulator-metal (MiM) capacitor, comprising:
   a continuous isolation region;
   a gate stack comprising:
      a gate dielectric over the continuous isolation region;
      a gate metal over the gate dielectric, the gate metal serving as a bottom electrode;
      gate spacers disposed adjacent opposing sides the gate dielectric, wherein a bottom surface of each gate spacer contacts the continuous isolation region, and wherein the continuous isolation region extends past a sidewall of each gate spacer opposing the gate dielectric;
   a dielectric layer disposed over the gate stack; and
   a top metal layer disposed over the dielectric layer, the top metal layer serving as a top electrode.

2. The capacitor of claim 1, wherein the dielectric layer is disposed upon the gate metal of the gate stack.

3. The capacitor of claim 1, wherein the top metal layer is disposed upon the dielectric layer.

4. The capacitor of claim 1, wherein the bottom electrode is in electrical communication with a first contact plug and the top electrode is in electrical communication with a second contact plug, the first contact plug passing through the dielectric layer and the top metal layer.

5. A metal-insulator-metal (MiM) capacitor, comprising:
   a continuous isolation region;
   a gate stack disposed upon and contacting the continuous isolation region, the gate stack including a gate metal, the gate metal serving as a bottom electrode, the gate stack having a bottom surface facing the continuous isolation region, the bottom surface of the gate stack having a first edge and a second edge, the first edge being on an opposing side of the gate stack from the second edge, wherein the continuous isolation region extends laterally past the first edge and the second edge of the gate stack;
   a dielectric layer disposed upon the gate stack; and
   a top metal layer disposed upon the dielectric layer, the top metal layer serving as a top electrode.

6. The capacitor of claim 5, wherein the gate metal abuts a portion of the dielectric layer.

7. The capacitor of claim 5, wherein the gate metal and the top metal layer are formed using a different metal.

8. The capacitor of claim 5, wherein a first width of the top metal layer is greater than a second width of the gate metal.

9. The capacitor of claim 5, wherein a first thickness of the top electrode is less than a second thickness of the bottom electrode.

10. The capacitor of claim 5, wherein the gate metal is in electrical communication with a first contact plug and the top metal layer is in electrical communication with a second contact plug, the first contact plug passing through the dielectric layer and the top metal layer.

11. A metal-insulator-metal (MiM) capacitor, comprising:
   a gate stack disposed upon an insulation layer, the gate stack including a gate metal, the gate metal serving as a bottom electrode;
   a dielectric layer disposed upon the gate stack; and
   a top metal layer disposed upon the dielectric layer, the top metal layer serving as a top electrode;
   wherein the gate metal is in electrical communication with a first contact plug and the top metal layer is in electrical communication with a second contact plug, the first contact plug passing through the dielectric layer and the top metal layer.

12. The capacitor of claim 11, wherein the gate metal abuts a portion of the dielectric layer.

13. The capacitor of claim 11, wherein the gate metal and the top metal layer are formed using a different metal.

14. The capacitor of claim 11, wherein a first width of the top metal layer is greater than a second width of the gate metal.

15. The capacitor of claim 11, wherein a first thickness of the top electrode is less than a second thickness of the bottom electrode.

16. The capacitor of claim 11, wherein a bottom surface of the dielectric layer is planar.

17. The capacitor of claim 11, wherein the dielectric layer comprises forming hafnium oxide ($HfO_2$) or aluminum oxide ($Al_2O_3$).

18. The capacitor of claim 11, wherein the top metal layer comprises one of tungsten (W), aluminum (Al), titanium nitride (TiN), and copper (Cu).

19. The capacitor of claim 11, wherein the gate metal comprises one of tungsten (W), aluminum (Al), titanium (Ti), titanium nitride (TiN), tantalum (Ta), copper (Cu), molybdenum (Mo), platinum (Pt), hafnium (hf), and ruthenium (Ru).

* * * * *